United States Patent [19]
Kunkel et al.

[11] Patent Number: 6,118,683
[45] Date of Patent: Sep. 12, 2000

[54] DYNAMIC RANDOM ACCESS MEMORY CELL LAYOUT

[75] Inventors: Gerhard Kunkel, Fishkill; Shahid Butt, Ossining; Carl J. Radens, LaGrangeville, all of N.Y.

[73] Assignees: Infineon Technologies North America Corporation, Cupertino, Calif.; International Business Machines Corporation, Armonk, N.Y.

[21] Appl. No.: 09/407,437

[22] Filed: Sep. 29, 1999

[51] Int. Cl.[7] ........................................ G11C 5/06
[52] U.S. Cl. ................... 365/63; 365/51; 365/149
[58] Field of Search ............................. 365/63, 149, 51; 257/296, 298

[56] References Cited

U.S. PATENT DOCUMENTS

| | | | |
|---|---|---|---|
| 5,526,303 | 6/1996 | Okajima | 365/154 |
| 5,569,949 | 10/1996 | Malhi | 257/397 |
| 5,812,443 | 9/1998 | Lee et al. | 365/149 |
| 6,051,461 | 4/2000 | Lee et al. | 438/241 |

*Primary Examiner*—Richard Elms
*Assistant Examiner*—Hien Nguyen
*Attorney, Agent, or Firm*—Stanton C. Braden

[57] ABSTRACT

A dynamic random access memory is formed in a silicon chip in arrays of clusters, each of four cells in a single active area. Each active area is cross-shaped with vertical trenches at the four ends of the two crossbars. The central region of the active area where the two crossbars intersect serves as the common base region of the four transistors of the cluster. The top of the base region serves as a common drain for the four transistors and each transistor has a separate channel along the wall of its associated vertical trench that provides its storage capacitor. Each cluster includes a common bit line and four separate word-line contacts.

7 Claims, 8 Drawing Sheets

DYNAMIC RANDOM ACCESS MEMORY CELL LAYOUT

FIELD OF INVENTION

This invention relates to a dynamic random access memory (DRAM), and more particularly, to the layout and interconnection of the memory cells in a DRAM to increase the density of cells in the DRAM.

BACKGROUND OF THE INVENTION

There is a continuing trend towards increasing the capacity of DRAMs. Such an increase in capacity is best achieved by decreasing the surface area of the memory cells and increasing their packing density to increase the size of the array in the silicon chip that houses the DRAM.

Various techniques have been used to increase the packing density. One technique has been to use a vertical trench to form the capacitor that serves as the storage site of the cell. Another technique has been to use as the switch transistor a vertical transistor formed on a sidewall of the vertical trench that provides the capacitor. Another technique has been to use a common drain and common bit line for a pair of switch transistors formed in a single active area that includes a pair of memory cells. Other techniques have involved particular shapes and layouts for the active area of the cell to permit more efficient packing.

SUMMARY OF THE INVENTION

The invention provides a novel layout and interconnection pattern for the cells of the array that forms the DRAM. It is characteristic of the layout that the cells are formed in clusters of four in a single active area. Each of the four transistors of the cluster has its own storage capacitor, advantageously a vertical trench capacitor. The four transistors share a common base region in which are formed four separate channels, each advantageously a vertical channel extending along a side wall of a different vertical trench. Each transistor has its own source, advantageously buried in the base region, that electrically contacts an inner plate of its associated trench capacitor. The drains of the four transistors advantageously are merged at the top surface of the base region in a single surface layer so that a single bit line can address each of the four transistors of the cluster by way of such merged drain. A different word line connects to each of the four gates of the four transistors of the cluster. For achieving economy in the number of gate-word line connections, the gates of four different transistors, each from a different active area cluster, share a common contact to a word line. Advantageously this is done by providing a common contact layer to the gate conductors of the four transistors to be interconnected to the single word line.

To achieve the structure described, the active areas that define the four transistors of a cluster advantageously are formed in a cross-like shape with the four ends of the two crossbars the sites of the four vertical trenches. Advantageously, the active areas are isolated from one another by a shallow dielectric trench in the bulk of the semiconductive chip that houses the DRAM.

Preferably, the active areas are so disposed that each word line can be straight and still make an electrical connection to the gate conductors of four different transistors in four different active areas by way of a single contact. Additionally, the active areas preferably are so disposed that the bit lines can be straight and still make contact to the merged drain contact of the four transistors of a cluster by extending essentially perpendicularly to the word lines over the surface of the chip.

Viewed from one aspect, the present invention is directed to a dynamic random access memory comprising a semiconductive chip at whose top surface there are a plurality of discrete active areas, each active area defining a cluster of four switch transistors and four storage capacitors, each storage capacitor being formed in a separate vertical trench, each of the four transistors including a separate source and a separate gate and sharing a common drain and a common base region that is formed between the four vertical trenches, the gate of each transistor being located to form in the base region a discrete channel extending between its source and the shared drain along a sidewall of a vertical trench and being connected to a separate word line, the source of each transistor being connected to the storage node of its associated storage capacitor, and the common drain of each transistor of a cluster being connected to a bit line.

Viewed from an other aspect, the present invention is directed to a memory cell cluster of four transistors for use in a dynamic random access memory that comprises an active top surface area that is essentially cross-like in shape with two intersecting crossbars characterized in that each end of the two crossbars defines a vertical trench housing the node of a storage capacitor and that further includes a common base region between the four vertical trenches of each cluster, said base region including four vertical transistors, each having its source and its drain positioned along a sidewall of a different vertical trench and between which in operation a channel is induced, the four sources being isolated from one another by the base region, and the four drains being merged together at the top surface of the base region.

The invention will be better understood from the following more detailed description taken with the accompanying drawing.

DETAILED DESCRIPTION OF THE INVENTION

Figure 1:
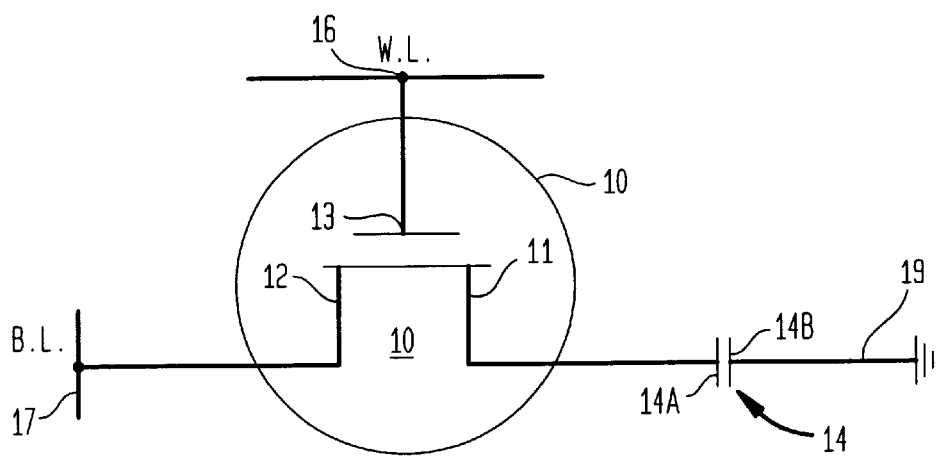
FIG. 1 shows schematically the basic circuitry of a standard single memory cell used in DRAMS.

FIG. 1 shows schematically a well known memory cell used in conventional DRAMS. The memory cell includes a switch 10, typically in the form of an N-channel MOSFET with a source 11, drain 12, and gate 13 that serves to form a channel in the base region when appropriate voltages are applied to the various electrodes. In series with the switch is a capacitor 14 that provides the storage node of the cell. A word line (W.L.) 16 applies a control signal to the gate 13, and a bit line (B.L.) 17 applies the other control voltage to the terminal 12 of the transistor that is generally described as the drain, although it is continually reversing this role with that of the source during the reading and writing operations. The other terminal 11 of the transistor, generally described as the source, is connected to one plate 14A of the capacitor, typically the plate formed by the conductive fill in a vertical trench capacitor. The other plate 14B of the capacitor is connected to a point 19 of reference potential, typically ground provided by the bulk of the silicon chip.

Figure 2:
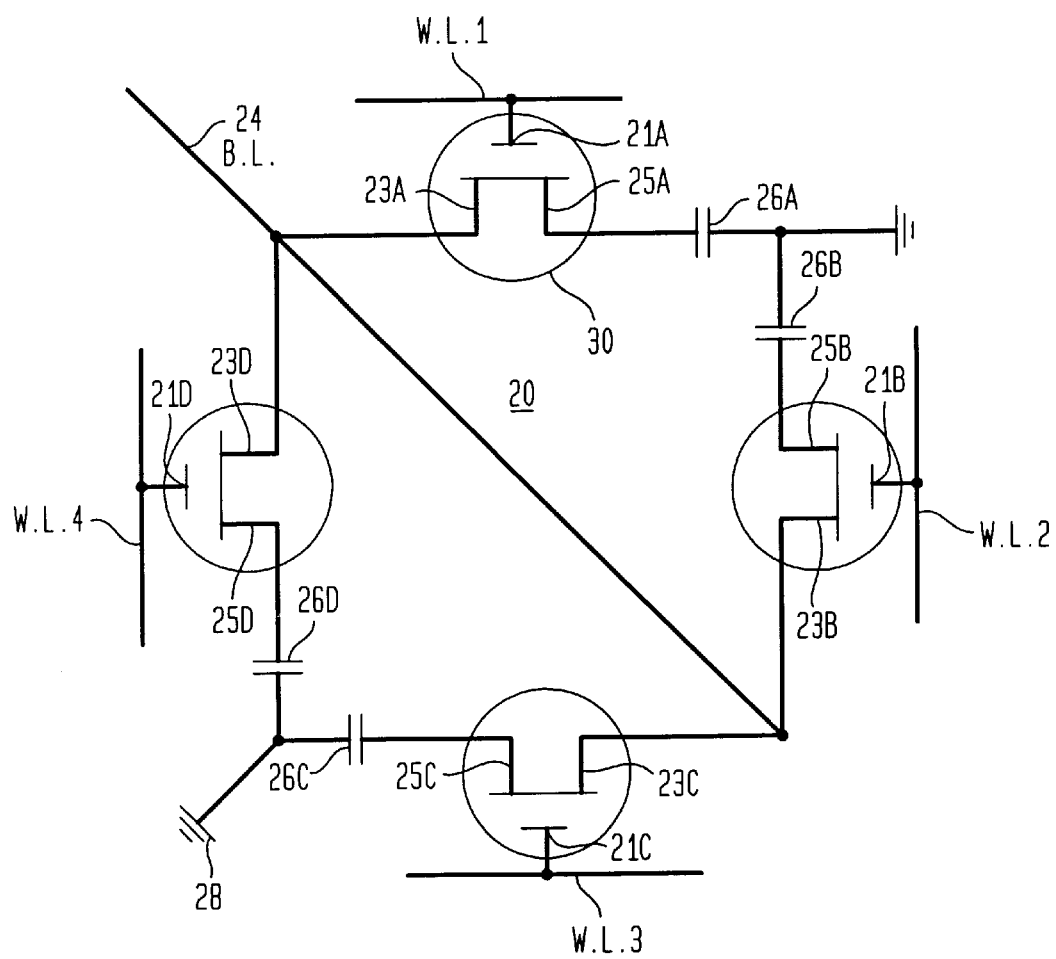
FIG. 2 shows schematically the basic circuitry of a single cluster of four memory cells that is characteristic of the invention.

FIG. 2 shows schematically a circuit configuration representative of a cluster 20 of four memory cells in a single active area of a semiconductor body, e.g., silicon, in accordance with the present invention. Each memory cell is of the kind shown in FIG. 1 and comprises a switch transistor and a storage capacitor. As is shown, four gates 21A, 21B, 21C, and 21D are connected to individual word lines W.L.1, W.L.2, W.L.3, and W.L.4, respectively. The four drains 23A, 23B, 23C, and 23D are connected to a common bit line (B.L.) 24. The four sources 25A, 25B, 25C, and 25D are connected by way of separate storage capacitors 26A, 26B, 26C, and 26D, respectively, to a point of reference potential, shown as ground 28.

Figure 3:
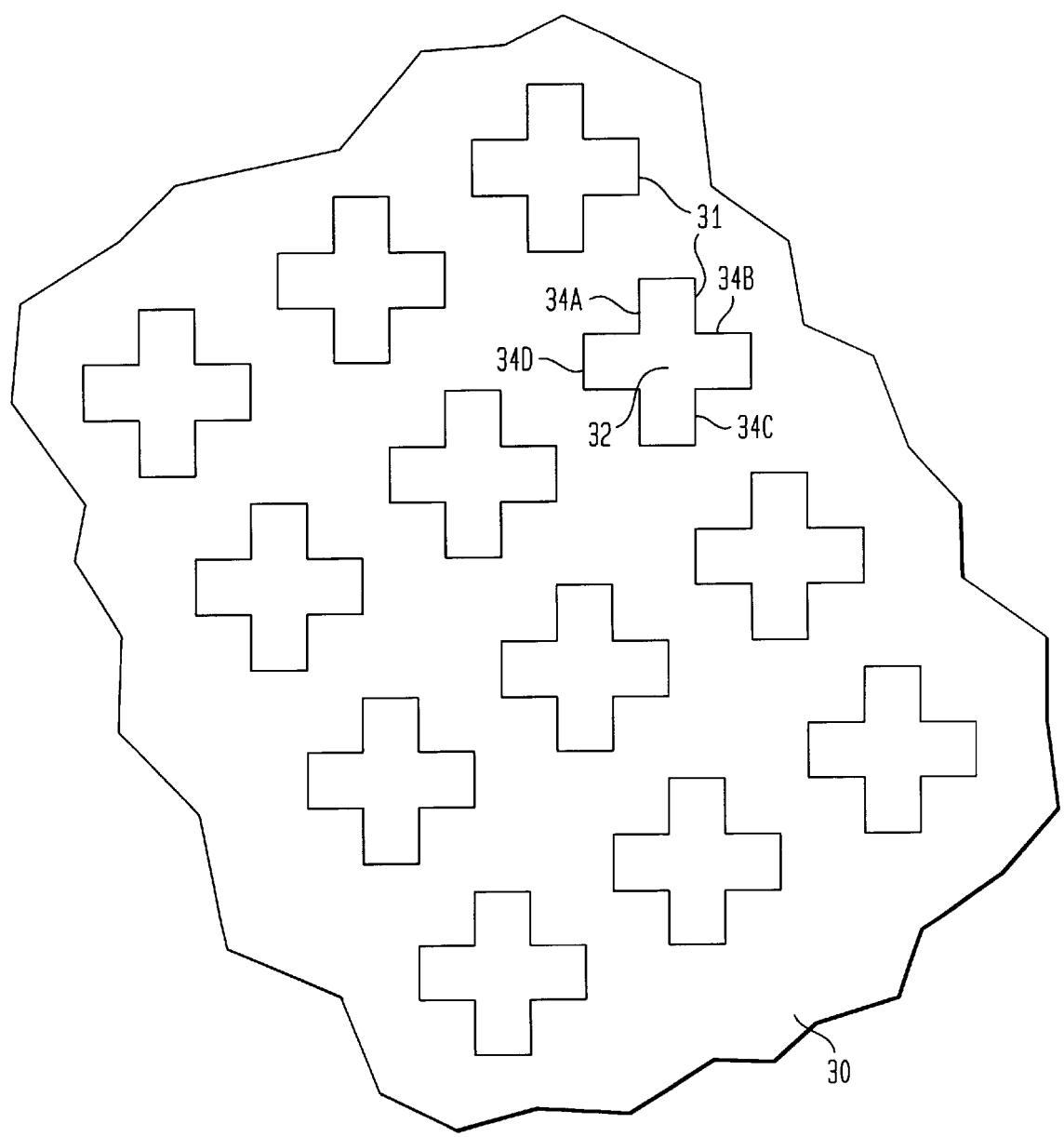
FIGS. 3–8 are different schematic top views of the silicon chip that houses the DRAM to be used in describing the layout of the different interconnection layers on the top surface of a DRAM in accordance with the present invention.

FIG. 3 is a schematic top view of a portion of a silicon chip 30 showing the layout of active areas 31, each of which is designed to house a cluster of four memory cells, as has been described above. As shown, each active area 31 includes a central region 32 from which extend four identical wings 34A, 34B, 34C, and 34D spaced symmetrically about the central region 32. It will be convenient to describe the shape of the active area as a symmetric cross made up of two identical crossbars that form the four wings. Each wing of the two crossbars will house at its ends a separate vertical trench that provides a storage capacitor of conventional design.

Figure 4:
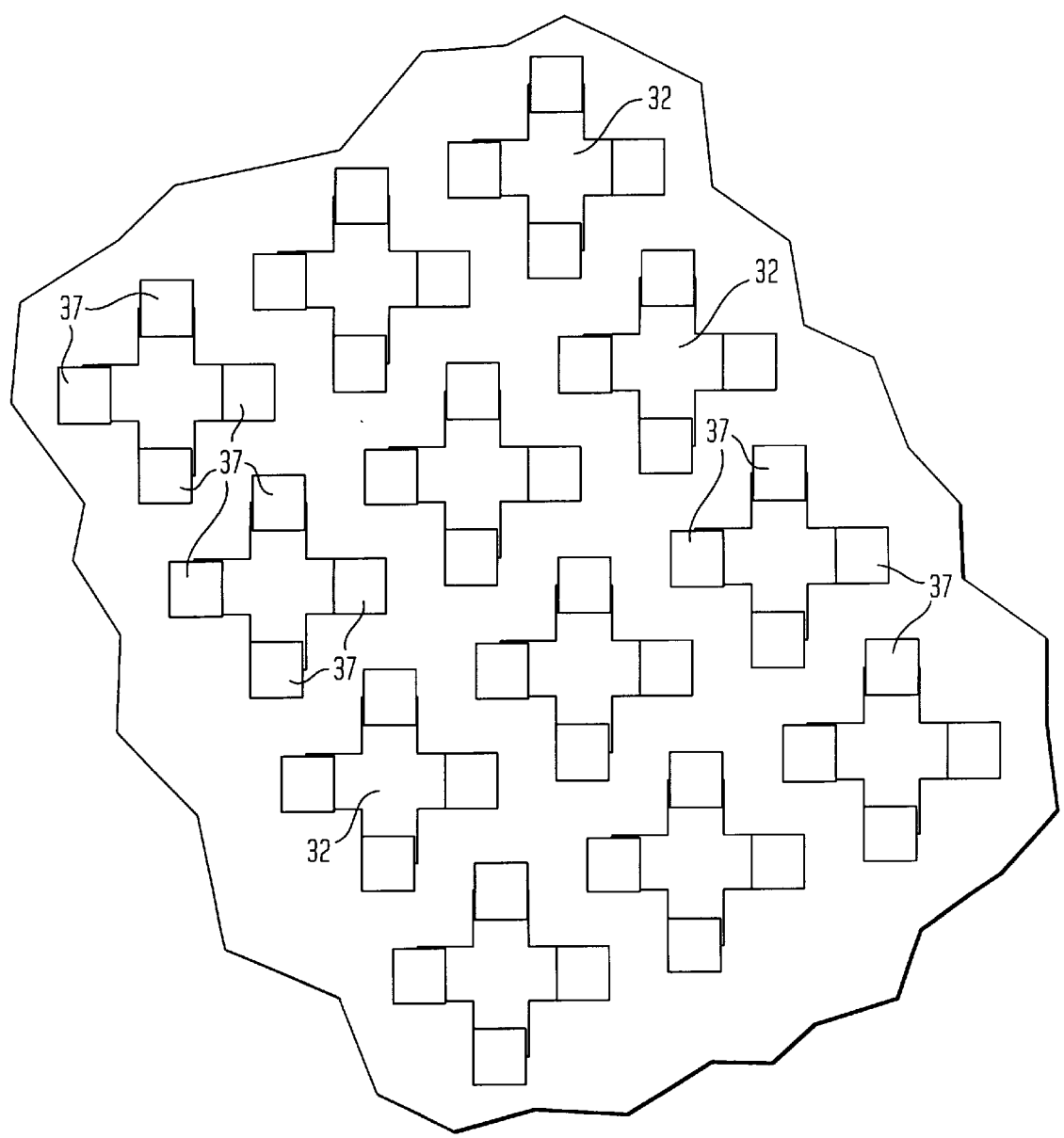

FIG. 4 is a schematic top view of the layout of FIG. 3 on which there is shown the location of a separate vertical trench 37 that is formed at each of the four wings of each active area 32.

Figure 5:
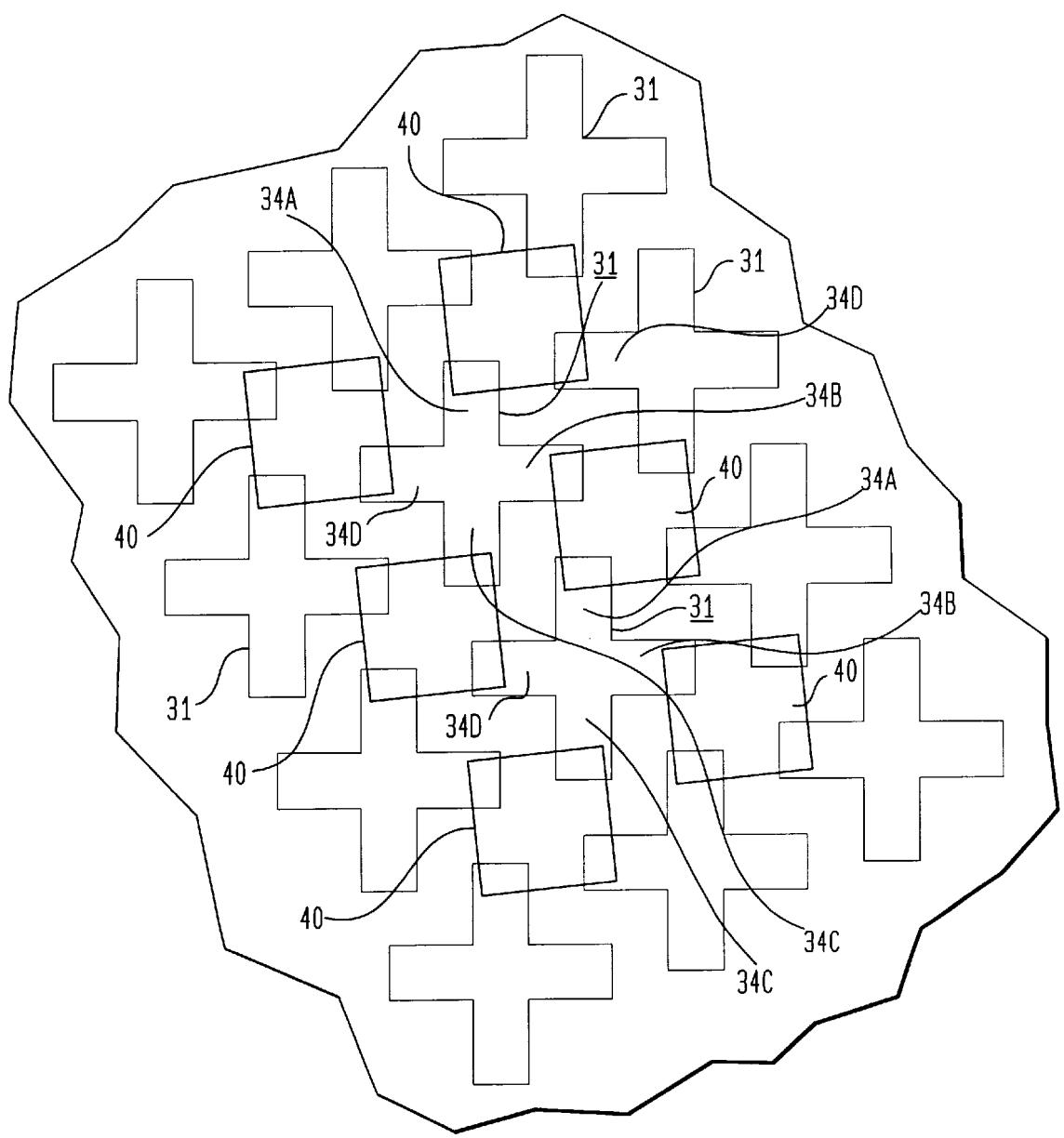

FIG. 5 shows in a schematic top view the layout of FIG. 3 over which has been superposed gate contact layers 40, each of which contacts the gate conductor of a selected one of the four transistors in a cluster. Each active area 31 will have superposed over the ends of its two crossbars four separate gate contact layers 40. For illustrative purposes, each of two of the centrally positioned active areas 31, (shown with an underscore under the reference number 31) has a separate gate layer 40 making electrical contact to each of wings 34A, 34B, 34C, and 35D thereof.

Figure 6:
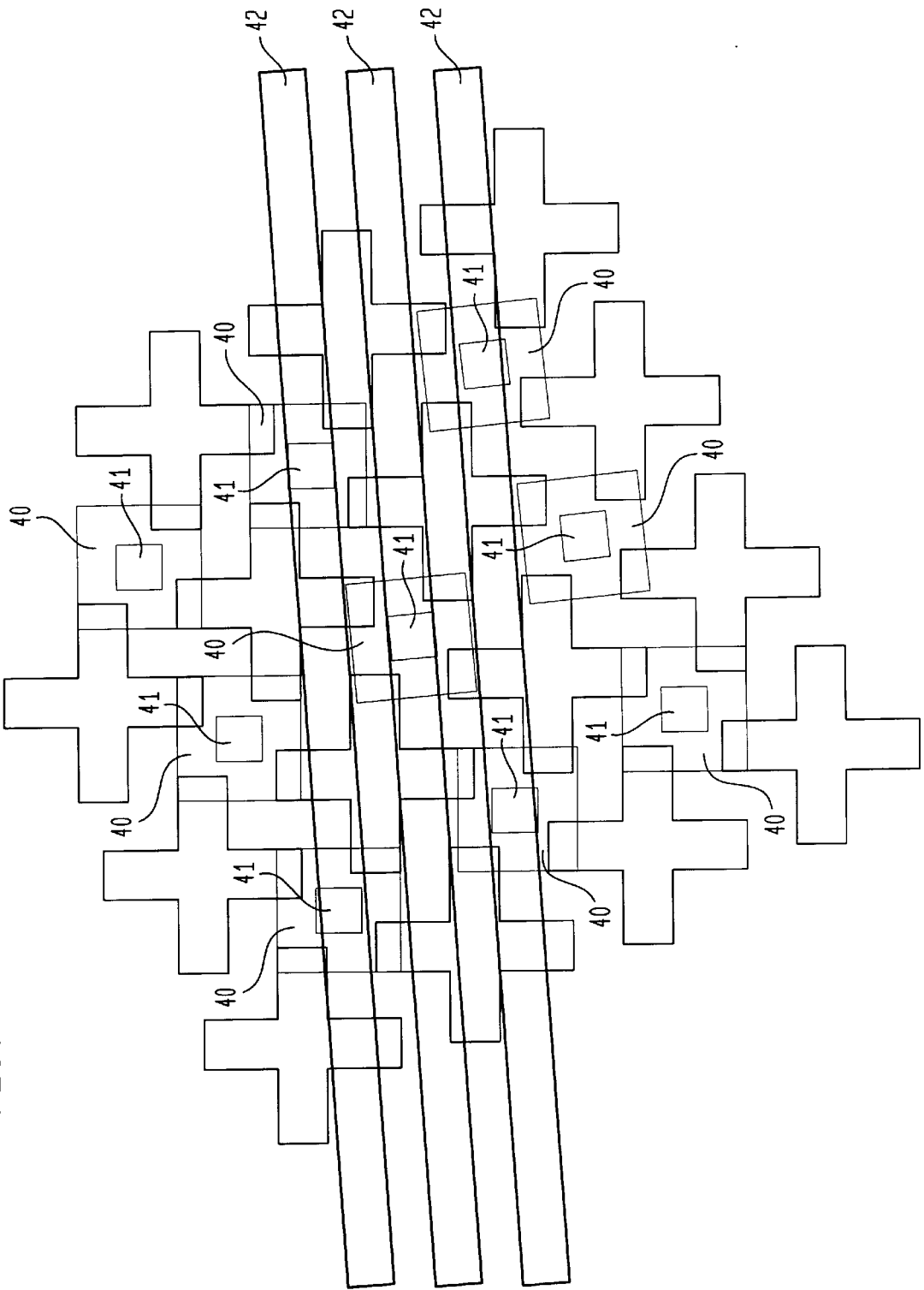

As seen in FIG. 6, superposed over each gate contact layer 40 is a narrowed word line contact plug 41 that is contacted by a word line 42 associated with the selected transistor of each cluster. This reduction of the contact area by the single contact plug 41 is useful to permit closer spacing of the word lines 42.

Figure 7:
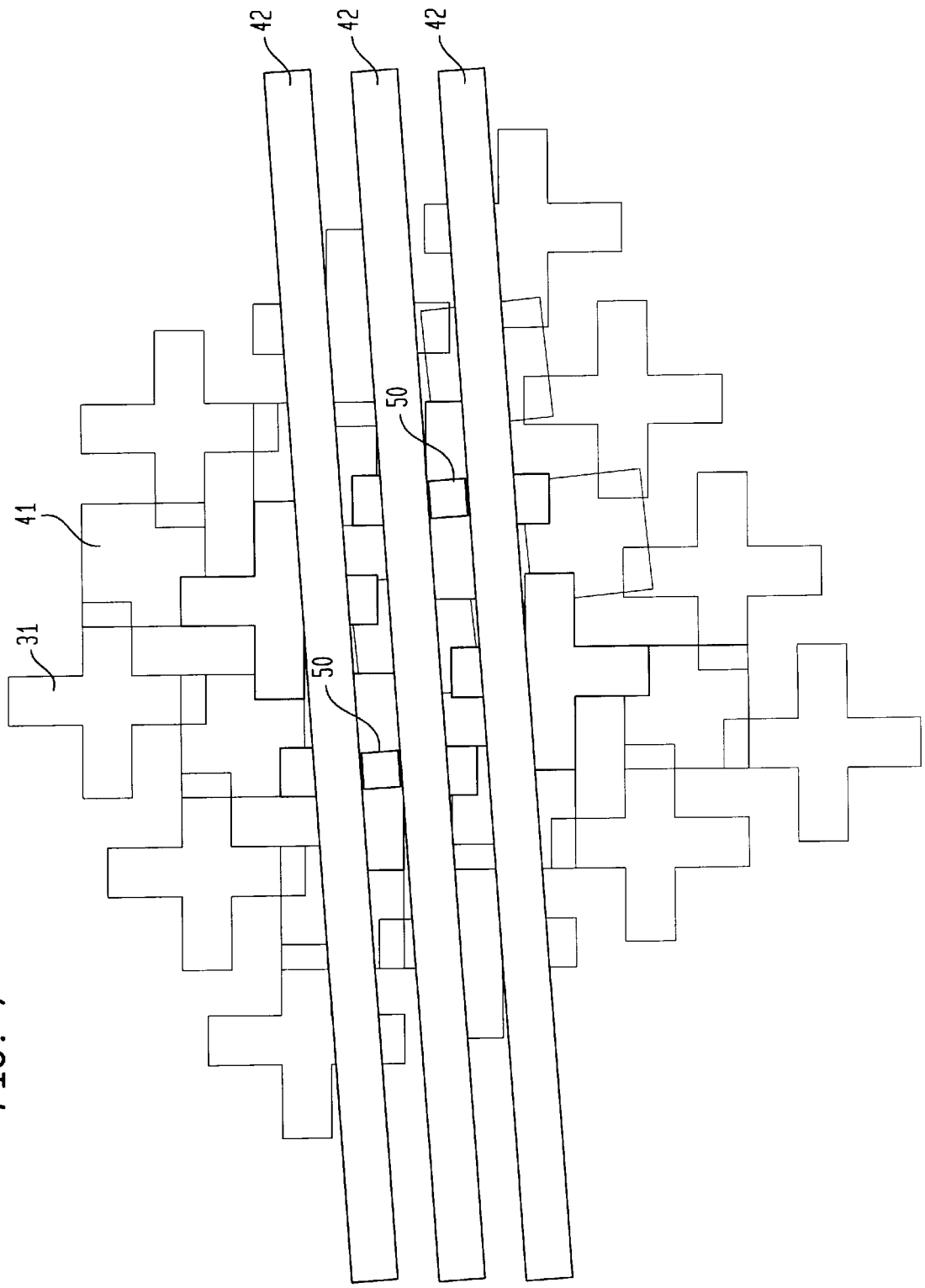

FIG. 7 shows superposed over the layout shown in FIG. 5 a bit line contact 50 to each of the common drain regions at the tops of each of the common base region of the four transistors of each cluster. The bit line contacts 50, and bit lines 62 discussed hereinbelow in connection with FIG. 8, are typically dielectrically isolated from the word lines 42.

Figure 8:
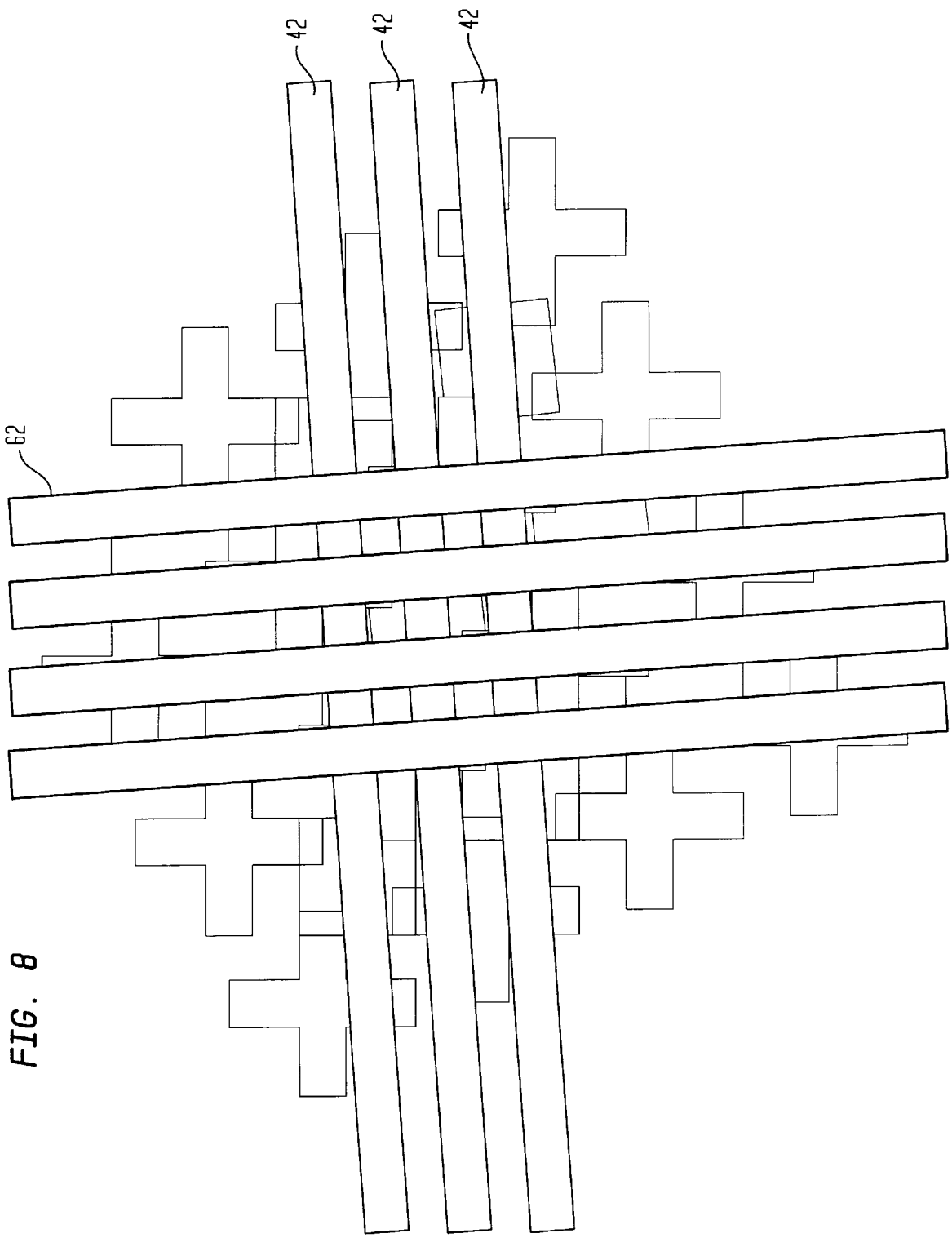

FIG. 8 shows bit lines 62 superposed over the layout shown in FIG. 7. Each bit line 62 passes over the word lines 42 perpendicularly to such lines. Typically, the bit lines of a suitable metal and are appropriately insulated from the word lines as they pass over them. It can be seen that the word lines 42 are tilted with respect to both the gate contact layers 40 shown in FIG. 6 and the word line plugs 41 shown in FIG. 6. To accommodate the tilt of the word lines 42, the bit lines 62 are corresponding tilted to be perpendicular to the word lines 42. Alternatively, the active areas can be tilted and the word lines run orthogonally therepast.

Figure 9:
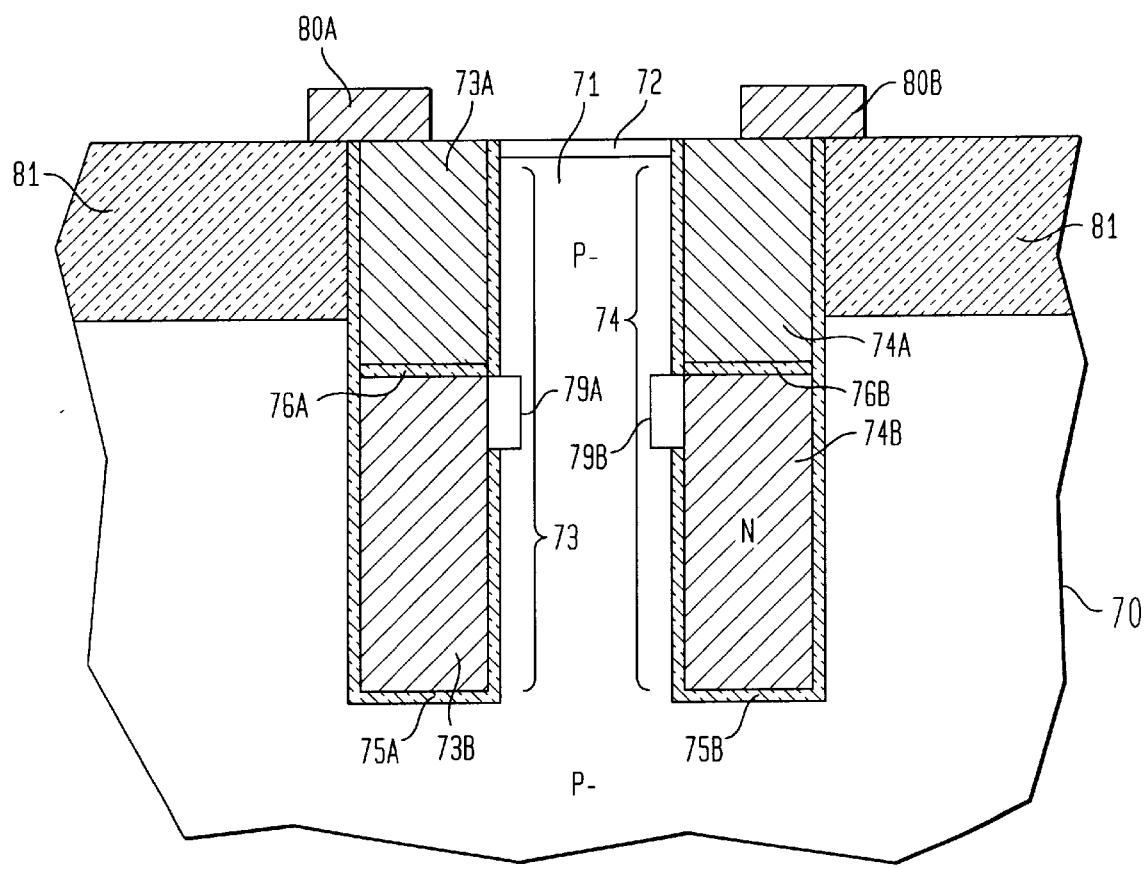
FIG. 9 is a vertical cross section of a cell that includes a vertical trench and a vertical transistor that has a channel that extends along a wall of the vertical trench, typical of the type of memory cell that would be used in active areas in clusters of four in a DRAM in accordance with the invention.

The layout scheme that has been described is adaptable to use with various forms of cells and is particularly adaptable for use with the form of memory cell of the kind shown in cross section in FIG. 9.

FIG. 9 shows across section of a silicon chip 70 that houses a memory cell that includes a central base region 71 that typically is monocrystalline silicon of p-type conductivity and includes an n-type conductivity merged drain 72 at the top surface of the base region 71. The base region 71 is centered within four wings, of which two are shown corresponding to vertical trenches 73 and 74. Each of these vertical trenches is largely enclosed within a separate dielectric layer 75A, 75B that serves as the dielectric of its capacitor and isolates its conductive fill from the base region 71. The conductive fill of each trench is divided into two portions, upper portions 73A and 74A and lower portions 73B and 74B, by a dielectric layers 76A and 76B, respectively. Each of the lower portions serves as the storage node of its capacitor and makes a conductive connection to the n-type source 79A, 79B of its associated transistor by way of a localized opening in the dielectric layer of the capacitor. Each of the upper portions 73A and 74A of the conductive fill serves as the gate and gate electrode to establish along the outside wall of the vertical trench a channel that extends between a separate source 79A, 79B and the merged drain 72 at the top of the base region 71 of its associated transistor. Gate contact layers 80A and 80B are extensions of the upper fills 73A and 74A, respectively, of a vertical trench and are advantageously formed as a separate conductive layers, and would contact separate word lines (not shown). Separate active areas are isolated from one another by way of the shallow trench isolation layer 81.

A DRAM of the kind described can be made in a variety of ways and the invention is essentially independent of its method of fabrication.

A cluster of four memory cells that is characteristic of the layout of a DRAM in accordance with the invention for example, can be made essentially by a process as follows.

One would begin by laying out in a wafer the desired location of groups of four storage nodes that are located there in the four vertical trenches that are appropriately distributed about a central base region as has been described. Then the various trenches and central areas are electrically isolated by a shallow trench isolation to define active areas. Each of the four vertical trenches is provided with a dielectric layer along its sidewalls to provide dielectric isolation and to serve as the dielectric layer of the storage capacitor that is to be formed by the trench.

Each trench is then be filled with a conductive material typically doped polysilicon, after which a recess is formed in each trench. Then an opening is formed in the sidewall of the capacitor dielectric layer to form the separate sources of the transistors, typically by outdiffusion of dopant from the doped polysilicon fill into the base region. Then a new dielectric layer is used to fill the trench and this layer is recessed to leave layers that will serve to isolate the lower portion of the conductive fill from the later deposited upper portion of the conductive fill of the trench. Then a dielectric layer is formed on the upper portion of the exposed wall of the trench to provide the dielectric layer that will serve as the gate dielectric of the vertical transistor. Then the recess in the trench is refilled with doped polysilicon that will serve as the upper portion of the fill for providing the gate and gate conductor of each transistor. The the drain can be formed at the top of the base region by diffusion from a conductive layer deposited thereover. Also there is then formed over each upper portion of the fill the narrowing conductive layer that will be used as the layer to which the word line will contact, as has been described.

Then the wiring of the gates can be done. Typically this is done by a first conductive layer that is patterned to interconnect the gate conductors of four transistors, each from a different cluster, as previously discussed. Next the word lines are formed from a conductive layer suitably patterned as previously described. Next there would be provided the drain contacts to the top surface of each of the base regions of the active areas. The common drain regions for each cluster can be formed by outdiffusion from the drain contact. Finally the drain regions are wired together by the bit lines. Of course, suitable dielectric layers would be included to provide the desired isolation between the bit and word lines.

It is to be understood that the specific embodiments described herein are illustrative of the general principles of the invention and that various modifications may be devises in the apparatus without departing from the spirit and scope of the present invention.

What is claimed is:

1. A dynamic random access memory comprising a semiconductive chip at whose top surface there are a plurality of discrete active areas, each active area defining a cluster of four switch transistors and four storage capacitors, each storage capacitor being formed in a separate vertical trench, each of the four transistors including a separate source and a separate gate and sharing a common drain and a common base region that is formed between the four vertical trenches, the gate of each transistor being located to form in the base region a discrete channel extending between its source and the shared drain along a sidewall of a vertical trench and being connected to a separate word line, the source of each transistor being connected to the storage node of its associated storage capacitor, and the common drain of each transistor of a cluster being connected to a bit line.

2. The dynamic random access memory of claim 1 in which the discrete active areas are isolated from one another by a shallow dielectric-filled trench.

3. The dynamic random access memory of claim 1 in which each transistor gate has associated with it a gate conductor and the gate conductors of groups of four transistors from four different active areas are connected to a common word line contact layer and a word line makes electrical connection to each of the four gates of the four transistors from the four active areas by way of such common word line contact layer.

4. The dynamic random access memory of claim 3 that further includes a plurality of word lines, each of which is essentially straight and makes electrical contact to a succession of word line layers along its length.

5. A memory cell cluster of four transistors for use in a dynamic random access memory that comprises an active top surface area that is essentially cross-like in shape with two intersecting crossbars characterized in that each end of the two crossbars defines a vertical trench housing the node of a storage capacitor and that further includes a common base region between the four vertical trenches of each cluster, said base region including four vertical transistors, each having its source and its drain positioned along a sidewall of a different vertical trench and between which in operation a channel is induced, the four sources being isolated from one another by the base region, and the four drains being merged together at the top surface of the base region.

6. The memory cell cluster of claim 5 in which each vertical trench is divided into upper and lower portions that are electrically isolated from one another, the conductive fill of the lower portion being the storage node of the vertical trench capacitor and electrically connected to the source of the associated transistor, and the conductive fill of the upper portion serving as the gate and gate electrode of the associated transistor.

7. A memory that includes a plurality of memory cell clusters each in accordance with claim 6 and in which each memory cell cluster is isolated from another by shallow trench isolation.

* * * * *